United States Patent
Liu et al.

(10) Patent No.: US 9,759,795 B2
(45) Date of Patent: Sep. 12, 2017

(54) SYSTEM FOR REDUCING ARTIFACTS IN IMAGING IN THE PRESENCE OF A SPIN-LOCK RADIO-FREQUENCY FIELD

(71) Applicants: Kecheng Liu, Solon (CN); Tiejun Zhao, Pittsburg, PA (US)

(72) Inventors: Kecheng Liu, Solon (CN); Tiejun Zhao, Pittsburg, PA (US)

(73) Assignee: Siemens Healthcare GmbH, Erlangen (DE)

( * ) Notice: Subject to any disclaimer, the term of this patent is extended or adjusted under 35 U.S.C. 154(b) by 1176 days.

(21) Appl. No.: 13/870,063

(22) Filed: Apr. 25, 2013

(65) Prior Publication Data

US 2014/0021951 A1 Jan. 23, 2014

Related U.S. Application Data

(60) Provisional application No. 61/673,275, filed on Jul. 19, 2012.

(51) Int. Cl.
*G01V 3/00* (2006.01)
*G01R 33/561* (2006.01)
*G01R 33/56* (2006.01)
*G01R 33/565* (2006.01)

(52) U.S. Cl.
CPC ....... *G01R 33/561* (2013.01); *G01R 33/5602* (2013.01); *G01R 33/5659* (2013.01); *G01R 33/56563* (2013.01)

(58) Field of Classification Search
CPC .................................................. G01R 33/561
USPC .................................. 324/309, 307, 306, 314
See application file for complete search history.

(56) References Cited

U.S. PATENT DOCUMENTS

| | | | |
|---|---|---|---|
| 6,836,114 B2 | 12/2004 | Reddy et al. | |
| 7,116,104 B2 | 10/2006 | Reddy et al. | |
| 7,705,596 B2 | 4/2010 | Witschey et al. | |
| 8,076,936 B2 | 12/2011 | Borthakur et al. | |
| 8,148,982 B2 | 4/2012 | Witschey et al. | |
| 9,211,082 B2 * | 12/2015 | Wald ...................... | A61B 5/055 |

(Continued)

OTHER PUBLICATIONS

Water R. T. Witschey II, et al., "Artifacts in T1ρ—weighted imaging: Compensation for B1 and B0 filed imperfections", Journal of Magnetic Resonance 186 (2007) 75-85.

(Continued)

*Primary Examiner* — Louis Arana

(57) ABSTRACT

A system acquires MR image data of a portion of patient anatomy associated with spin lattice relaxation time in a rotating frame using an RF (Radio Frequency) signal generator and a magnetic field gradient generator. The RF (Radio Frequency) signal generator generates RF excitation pulses in anatomy and enables subsequent acquisition of associated RF echo data. The magnetic field gradient generator generates anatomical volume select magnetic field gradients for phase encoding and readout RF data acquisition in a three dimensional (3D) anatomical volume. The RF signal generator and the gradient generator use in order, a saturation pulse, a T1 spin lattice relaxation rotating frame preparation pulse sequence and a spoiler gradient, in acquiring image data of the 3D volume showing luminance contrast associated with T1 spin lattice relaxation in a rotating frame.

17 Claims, 7 Drawing Sheets

(56) References Cited

U.S. PATENT DOCUMENTS

2011/0028828 A1 2/2011 Daye et al.
2014/0035580 A1* 2/2014 Andronesi ............. G01R 33/36
　　　　　　　　　　　　　　　　　　　　　　　　324/309

OTHER PUBLICATIONS

Xiaojuan Li, et al., In vivo T1ρ Mapping in Cartilage Using 3D Magnetization-Prepared Angle-Modulated Partitioned k-Space Spoiled Gradient Echo Snapshots (3D MAPSS), Magnetic Resonance in Medicine 59: 298-307 (2008).

* cited by examiner

SYSTEM FOR REDUCING ARTIFACTS IN IMAGING IN THE PRESENCE OF A SPIN-LOCK RADIO-FREQUENCY FIELD

This is a non-provisional application of provisional application Ser. No. 61/673,275 filed Jul. 19, 2012, by K. Liu et al.

FIELD OF THE INVENTION

This invention concerns a system for acquiring MR imaging data of a portion of patient anatomy associated with spin lattice relaxation time in a rotating frame.

BACKGROUND OF THE INVENTION

Known systems for spin-lock magnetic field preparation that generate T1rho contrast associated with a spin lattice relaxation time constant in a rotating frame, are limited by SAR (Specific Absorption Rate) constraints. This is because a long radiofrequency (RF) pulse is needed to generate the required T1rho contrast. The known systems are also vulnerable to inhomogeneity in the static magnet field (B0) and also a dynamic transmission RF field (B1). Attempts to reduce resulting artifacts involve longer imaging time and increased risk of patient motion and mis-registration artifacts. A system according to invention principles addresses these deficiencies and associated problems and provides improves spin-lock magnetic field preparation.

SUMMARY OF THE INVENTION

A system improves spin-lock magnetic field preparation by providing a pulse sequence that reduces length of a radiofrequency (RF) pulse needed to generate required T1rho contrast as well as sensitivity to static magnet field (B0) and also dynamic transmission RF field (B1) inhomogeneity. A system acquires MR image data of a portion of patient anatomy associated with spin lattice relaxation time in a rotating frame using an RF (Radio Frequency) signal generator and a magnetic field gradient generator. The RF (Radio Frequency) signal generator generates RF excitation pulses in anatomy and enables subsequent acquisition of associated RF echo data. The magnetic field gradient generator generates anatomical volume select magnetic field gradients for phase encoding and readout RF data acquisition in a three dimensional (3D) anatomical volume. The RF signal generator and the gradient generator use in order, a saturation pulse, a T1 spin lattice relaxation rotating frame preparation pulse sequence and a spoiler gradient, in acquiring image data of the 3D volume showing luminance contrast associated with T1 spin lattice relaxation in a rotating frame.

BRIEF DESCRIPTION OF THE DRAWING

FIG. 2A shows a known T1rho pulse sequence and FIG. 2B shows a pulse sequence including one (or more) saturation pulses preceding spin-lock preparation RF pulses, according to invention principles.

FIG. 3A shows a known pulse sequence using phase cycling to eliminate T1 relaxation effects between spin-lock and imaging readout requiring at least two averages.

DETAILED DESCRIPTION OF THE INVENTION

A system improves spin-lock magnetic field preparation using a pulse sequence that reduces length of a radiofrequency (RF) pulse needed to generate image contrast due to T1rho as well as sensitivity to static magnet field (B0) and also dynamic transmission RF field (B1) inhomogeneity. T1 rho image contrast is due to spin lattice relaxation time constant in the rotating frame and decay of the transverse magnetization in the presence of a "spin-lock" radio-frequency field.

Figure 1:
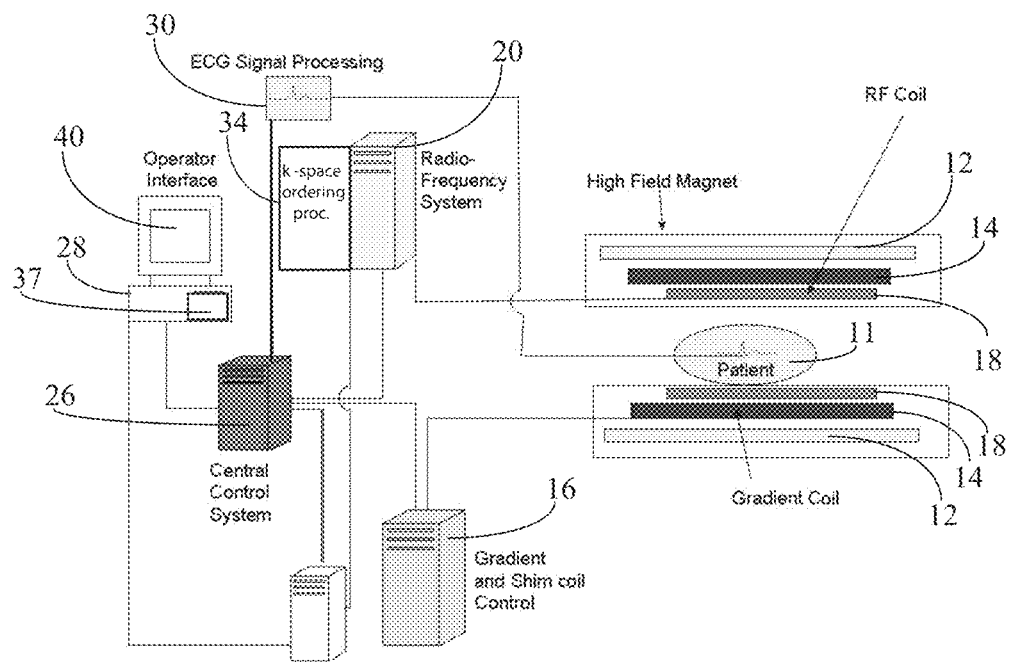
FIG. 1 shows a system for acquiring MR imaging data of a portion of patient anatomy associated with spin lattice relaxation time in a rotating frame, according to invention principles.

FIG. 1 shows system 10 for acquiring MR imaging data of a portion of patient anatomy associated with spin lattice relaxation time in a rotating frame. In system 10, magnet 12 creates a static base magnetic field in the body of patient 11 to be imaged and positioned on a table. Within the magnet system are gradient coils 14 for producing position dependent magnetic field gradients superimposed on the static magnetic field. Gradient coils 14, in response to gradient signals supplied thereto by a gradient and shimming and pulse sequence control module 16, produce position dependent and shimmed magnetic field gradients in three orthogonal directions and generates magnetic field pulse sequences. The shimmed gradients compensate for inhomogeneity and variability in an MR imaging device magnetic field resulting from patient anatomical variation and other sources. The magnetic field gradients include a slice-selection gradient magnetic field, a phase-encoding gradient magnetic field and a readout gradient magnetic field that are applied to patient 11.

Further RF (radio frequency) module 20 provides RF pulse signals to RF coils 18, which in response produce magnetic field pulses which rotate the spins of the protons in the imaged body 11 by ninety degrees or by one hundred and eighty degrees for so-called "spin echo" imaging, or by angles less than or equal to 90 degrees for so-called "gradient echo" imaging. Pulse sequence control module 16 in conjunction with RF module 20 as directed by central control unit 26, control slice-selection, phase-encoding, readout gradient magnetic fields, radio frequency transmission, and magnetic resonance signal detection, to acquire magnetic resonance signals representing planar slices of patient 11.

In response to applied RF pulse signals, the RF coils 18 receives MR signals, i.e., signals from the excited protons within the body as they return to an equilibrium position established by the static and gradient magnetic fields. The MR signals are detected and processed by a detector within RF module 20 and k-space component processor unit 34 to provide image representative data to an image data processor in central control unit 26. ECG synchronization signal generator 30 provides ECG signals used for pulse sequence and imaging synchronization. A two or three dimensional k-space storage array of individual data elements in unit 34 stores corresponding individual frequency components comprising an MR dataset. An RF (Radio Frequency) signal generator comprising module 20 and RF coils 18 generates RF excitation pulses in anatomy and enables subsequent acquisition of associated RF echo data. A magnetic field gradient generator (comprising magnetic coils 12 and 14) generates a magnetic field for use in acquiring multiple individual frequency components and generates anatomical volume select magnetic field gradients for phase encoding and readout RF data acquisition in a three dimensional (3D) anatomical volume. RF signal generator units 18 and 20 and gradient generator units 12 and 14 use in order, a saturation pulse, a T1 spin lattice relaxation rotating frame preparation pulse sequence and a spoiler gradient, in acquiring image data of the 3D volume showing luminance contrast associated with T1 spin lattice relaxation in a rotating frame.

Central control unit 26 uses information stored in an internal database to process the detected MR signals in a coordinated manner to generate high quality images of a selected slice (or slices) of the body and adjusts other parameters of system 10. The stored information comprises predetermined pulse sequence and magnetic field gradient and strength data as well as data indicating timing, orientation and spatial volume of gradient magnetic fields to be applied in imaging. Generated images are presented on display 40. Computer 28 includes a graphical user interface (GUI) enabling user interaction with central controller 26 and enables user modification of magnetic resonance imaging signals in substantially real time. Display processor 37 processes the magnetic resonance signals to provide image representative data for display on display 40, for example.

Figure 2B:
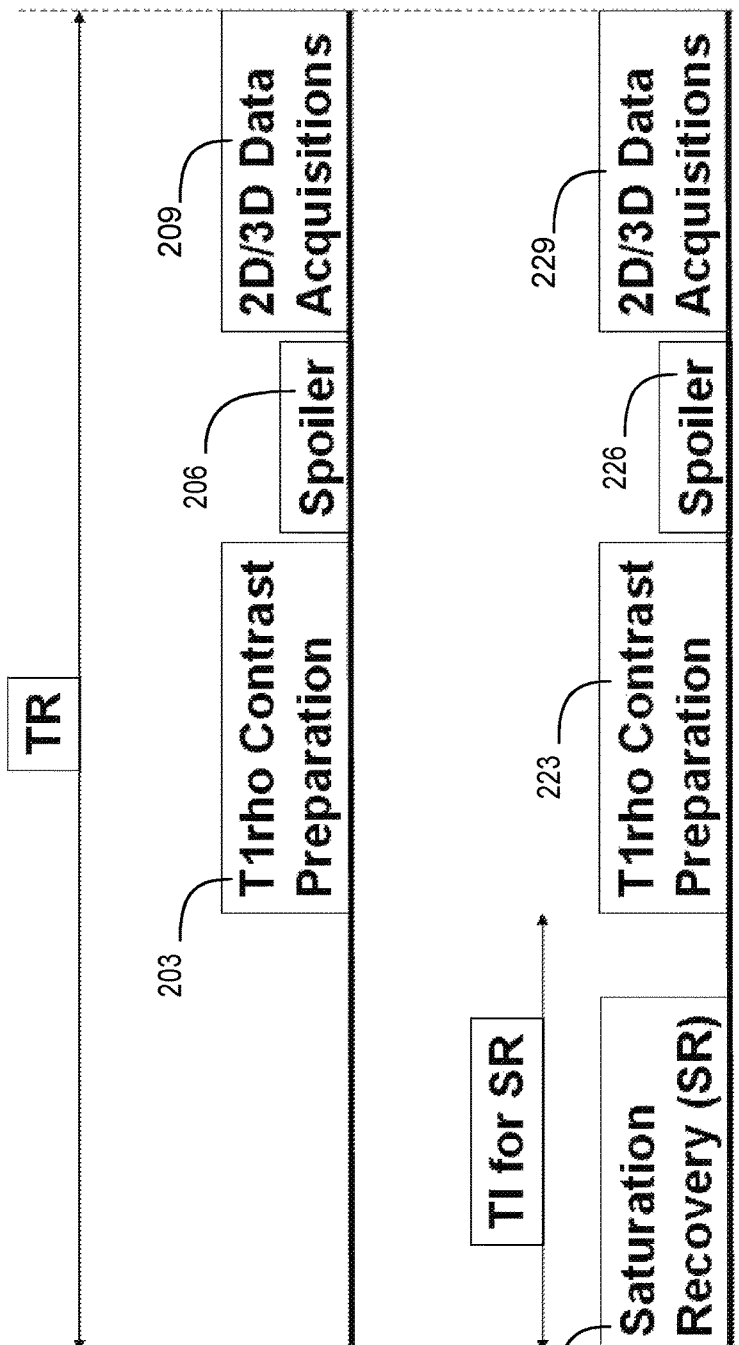

FIG. 2A shows a known T1rho pulse sequence and FIG. 2B shows a pulse sequence including one (or more) saturation pulses before spin-lock preparation RF pulses. The known T1 rho pulse sequence comprises a T1 rho preparation pulse sequence 203, spoiler gradient pulse 206 and readout pulses for 2D or 3D data acquisition 209. System 10 advantageously employs saturation pulse sequence (module) 221 preceding T1rho preparation pulse sequence 223, spoiler gradient pulse 226 and readout pulses for 2D or 3D data acquisition 229. Saturation pulse sequence (module) 221 reduces length of a radiofrequency (RF) pulse needed to generate image contrast due to T1rho as well as sensitivity to static magnet field (B0) and also dynamic transmission RF field (B1) inhomogeneity.

The inventors have experimentally determined that T1rho maps are contaminated by T1 (longitudinal (or spin-lattice)) relaxation time if TR (repetition time between successive RF excitation pulses) is not long enough in comparison with the T1. Experimental data indicates that T1 contamination is substantially minimized if TR is approximately 3-5 times T1. However, this make the total experiment time long, especially for 3D MR image data acquisition. Known systems address this by using long repetition time, where TR is approximately 3-5 times T1. However, system 10 (FIG. 1) advantageously employs saturation pulse sequence 221 at the beginning of the T1rho sequence. In this way, the Mz (RF magnetic field in z direction) is reset to zero by the saturation pulse sequence. Thus, the Mz at the time of spin-lock preparation is solely determined by the time elapsed between the saturation module and spin-lock preparation module. The influence of sequence repetition time (TR) on the final T1rho map is thus eliminated. The saturation pulse sequence improves T1rho mapping robustness. In other embodiments other prior saturation pulses or composite saturation pulses are used for this purpose. The saturation module comprises either a single 90 degree excitation pulse following by a spoiling gradient or a train of excitation pulses followed by spoiling pulses (e.g., as described in Kim D et al., Magn. Reson. Med. 2008 January; 59(1):209-15).

In addition to the T1 contamination due to short TR, the T1 relaxation between the magnetization stored as an Mz component at the end of T1rho contrast preparation module 223 to the excitation pulse for imaging, also contributes artifacts in an image. The T1 relaxation during this time period (e.g., during the spoiler gradient 226 period) contributes fresh spins so that a final image is the sum of the T1rho weighted image plus the fresh spins from the T1 relaxation.

Figure 3B:
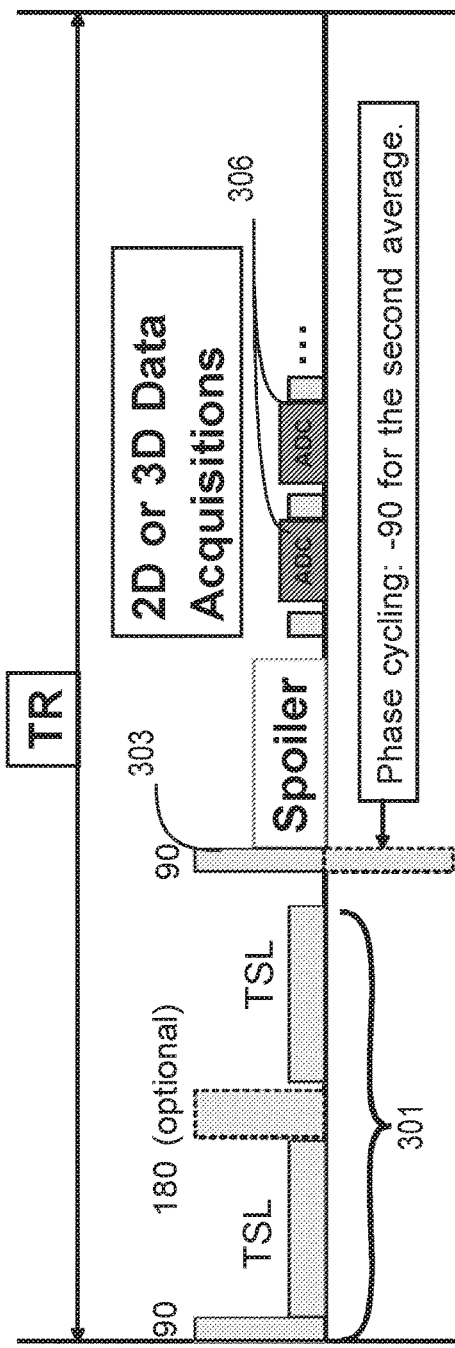
FIG. 3B shows a pulse sequence using STEAM (Single-shot stimulated-echo acquisition mode) and pairs of gradients for stimulated echoes to eliminate the need for phase cycling, according to invention principles.
Figure 3B:
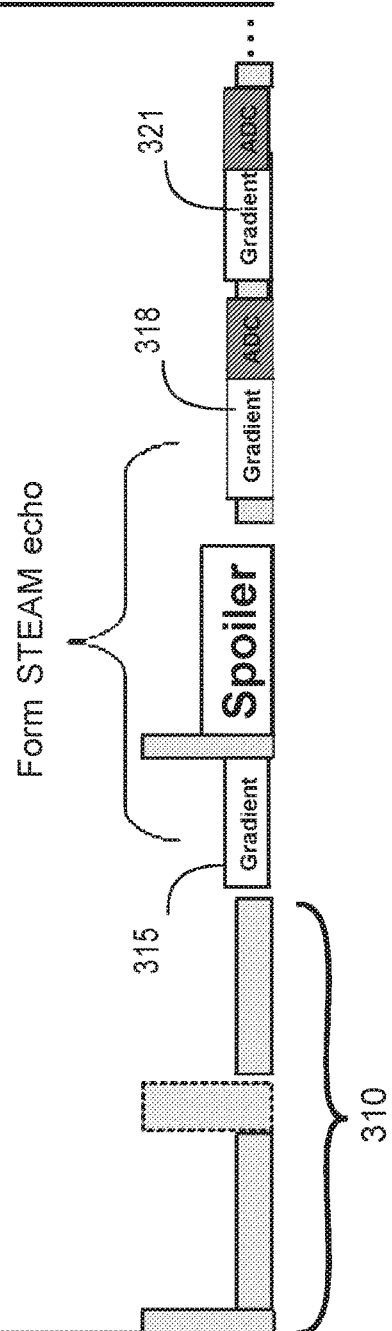

FIG. 3A shows a known pulse sequence using phase cycling to eliminate T1 relaxation effects between spin-lock and imaging readout requiring at least two averages of MR images that are acquired with identical pulse trains except for the phases of the RF pulses, FIG. 3B shows a pulse sequence using STEAM (Single-shot stimulated-echo acquisition mode) and pairs of gradients for stimulated echoes to eliminate the need for phase cycling. Known systems address T1 contamination using phase cycling as shown in FIG. 3A by using T1rho contrast preparation module 301 that employs a sequence of, a 90 degree excitation pulse, a spin lock pulse, an optional refocus pulse, a spin lock pulse, and a second 90 degree excitation pulse. In this method, following spin lock preparation 301, the phases of the second 90 degree RF pulse 303 and the data acquisition ADC (analog to digital conversion) 306 where one line of k-space frequency domain components is acquired, alternate by 180 degree for the odd and even averages. In this average method, the new fresh spin contribution is removed. However, modest two averages may double total scan time and the time extension increases risk of artifact due to patient motion and other system instabilities during the averaging that compromise results.

System 10 (FIG. 1) in one embodiment advantageously uses stimulated echo as shown in FIG. 3B instead of averaging to reduce the scan time and thus reduce the total SAR (Specific Absorption Rate) deposition. In this method, the spins at the end of a T1 rho spin lock preparation module 310 are encoded by applying a magnetic gradient 315. Information is recalled after each excitation before the imaging module (analog to digital conversion) by applying an identical gradient 318, 321 for decoding. For imaging with 3D cases (e.g., turbo-flash readout), each excitation pulse normally excites (thus recalls) a part of stored encoded magnetization in the z direction using the last 90 degree pulse. Each pair of gradients that occur before the last 90 restore pulse and after each excitation, form a stimulated echo. A disadvantage of using the STEAM (Single-shot stimulated-echo acquisition mode) method as in FIG. 3B is that the signal-to-noise ratio is reduced by half. However, the robustness to motion and shorter scan time, thus less total SAR, makes the STEAM method useful for many cases, particularly in ultra high field MRI systems such as 7T (Tesla) systems.

Figures 4A, 4B, 4C:
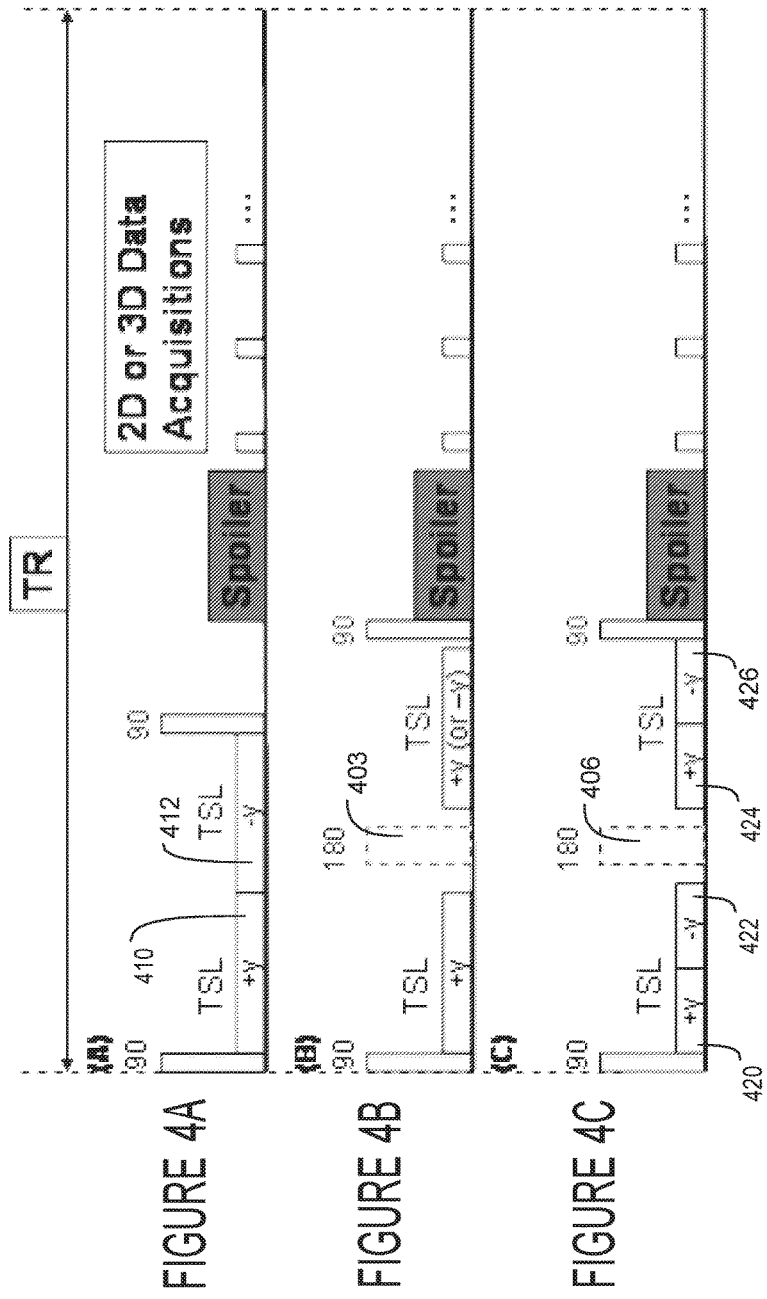
FIG. 4A shows a known pulse sequence using a spin rotary method to minimize B1 artifacts.
FIG. 4B shows a known pulse sequence using a 180 degree refocusing pulse to reduce B0 artifacts and FIG. 4C shows a spin-lock preparation pulse sequence using a spin rotary method at both sides of a refocusing pulse to minimize both B1 and B0 artifacts, according to invention principles.
Figure 5:
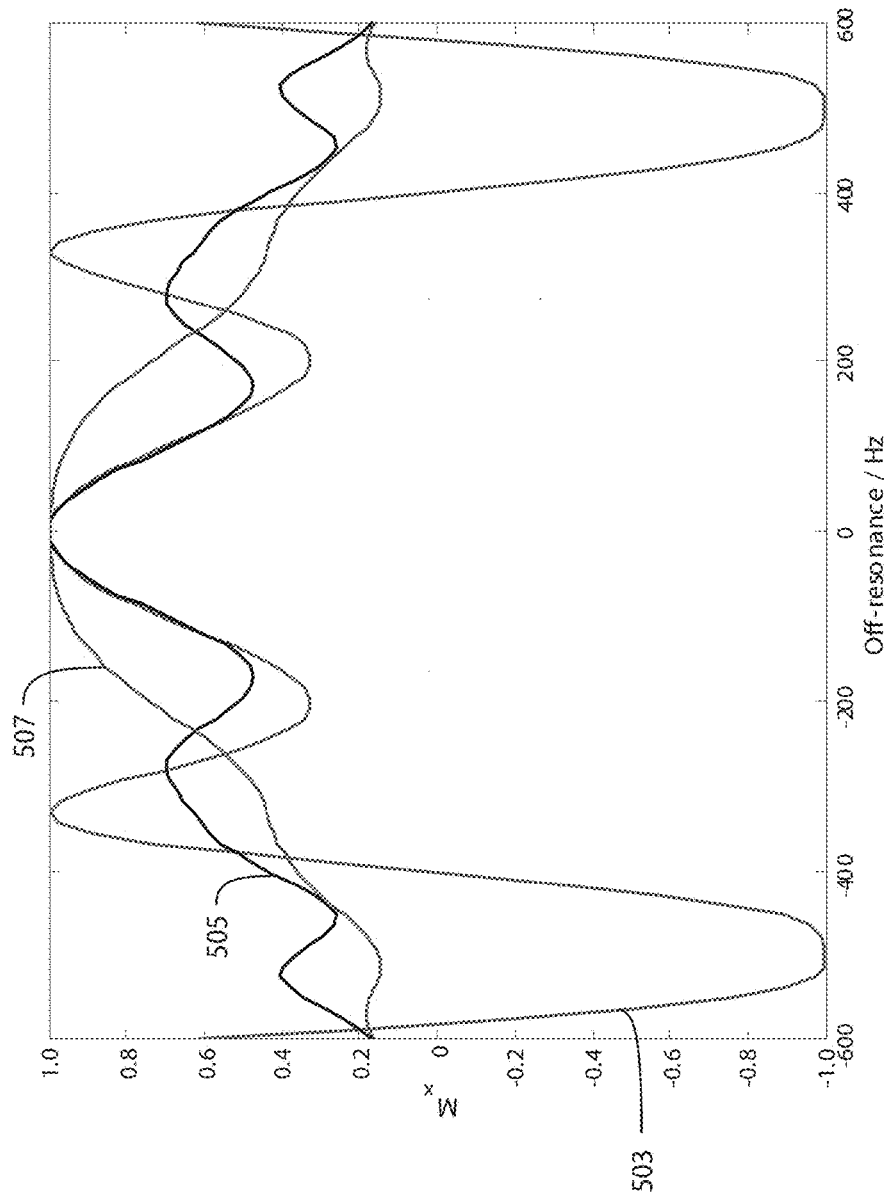
FIG. 5 shows Bloch simulation results for different T1rho preparation pulse sequences shown in FIGS. 4A, 4B and 4C demonstrating improved performance for the pulse sequence of FIG. 4C around the ±200 Hz range, according to invention principles.

FIG. 4A shows a known pulse sequence using a spin rotary method to minimize B1 artifacts, FIG. 4B shows a known pulse sequence using 180 degree refocusing pulse 403 to reduce B0 artifacts and FIG. 4C shows a spin-lock preparation pulse sequence advantageously using a spin rotary method at both sides of refocusing pulse 406 to minimize both B1 and B0 artifacts. A T1 rho preparation method is used to create T1rho contrast weighted magnetization and is stored in the z direction as Mz for subsequent 2D or 3D imaging using one of different 2D or 3D MR image acquisition pulses sequences. A T1rho image contrast map is generated by exponential fitting by varying the time for the spin locking (TSL). Known systems reduce B1 inhomogeneity by having a different spin lock pulse and refocus pulse that differ by 90 degrees when compared to a first 90 degree excitation pulse. The known system of FIG. 4A also uses a spin rotary method, which splits the spin lock pulse in two parts 410, 412 that have a 180 degree phase difference, to reduce B1 artifacts. Another known system uses 180 degree refocusing pulse 403 to reduce B0 related artifacts and reduce effect of B0-inhomogeneity as in FIG. 4B. System 10 reduces sensitivity to both B1 and B0 by advantageously using a rotary spin lock method including two part split spin lock pulse pairs 420, 422 and 424, 426 provided both sides of 180 degree refocusing pulse 406 as shown in FIG. 4C FIG. 5 shows Bloch simulation results for the different T1rho preparation pulse sequences shown in FIG. 4 (total spin lock time=10 ms) presenting magnetization in the x direction plotted against off resonance frequency (Hz). Curve 507 demonstrates improved performance for the pulse sequence of FIG. 4C around the ±200 Hz range. Curve 503 corresponds to the pulse sequence of FIG. 4A and curve 505 corresponds to the pulse sequence of FIG. 4B.

Figure 6:
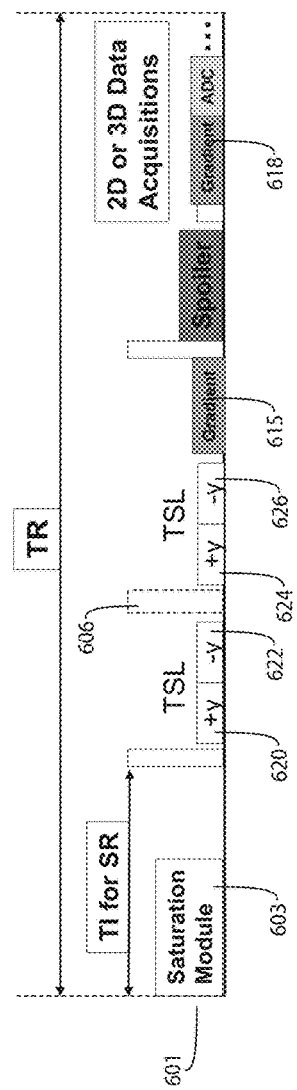
FIG. 6 shows a pulse sequence incorporating multiple advantageous features according to invention principles.

FIG. 6 shows pulse sequence 601 incorporating multiple advantageous features. System 10 in different embodiments uses a saturation pulse sequence 603 for reducing TR (thus total scan time) and uses an advantageous T1rho preparation method with improved off-resonance response and also applies a STEAM echo sequence to eliminate averaging requirements for accurate T1rho mapping (providing less scan time and total SAR). Specifically, System 10 reduces sensitivity to both B1 and B0 by advantageously using a rotary spin lock method including two part split spin lock pulse pairs 620, 622 and 624, 626 provided both sides of 180 degree refocusing pulse 606. Further in applying the STEAM method, the proton spins following T1rho spin lock preparation pulse 626 are encoded by applying a gradient 615. The information is recalled after each excitation before the imaging module (analog to digital conversion) by applying an identical gradient 618 for decoding.

System 10 advantageous features include, (a) a saturation pulse sequence, (b) a T1rho preparation sequence with improved off-resonance response and (c) a STEAM echo sequence using split spin lock pulse pairs to eliminate averaging requirements for accurate T1rho mapping. These features may be implemented in a single pulse sequence, or may be used separately or together in different combinations and may be integrated into another T1rho sequence for a particular application and in other pulse sequences for other specific applications.

Figure 7:
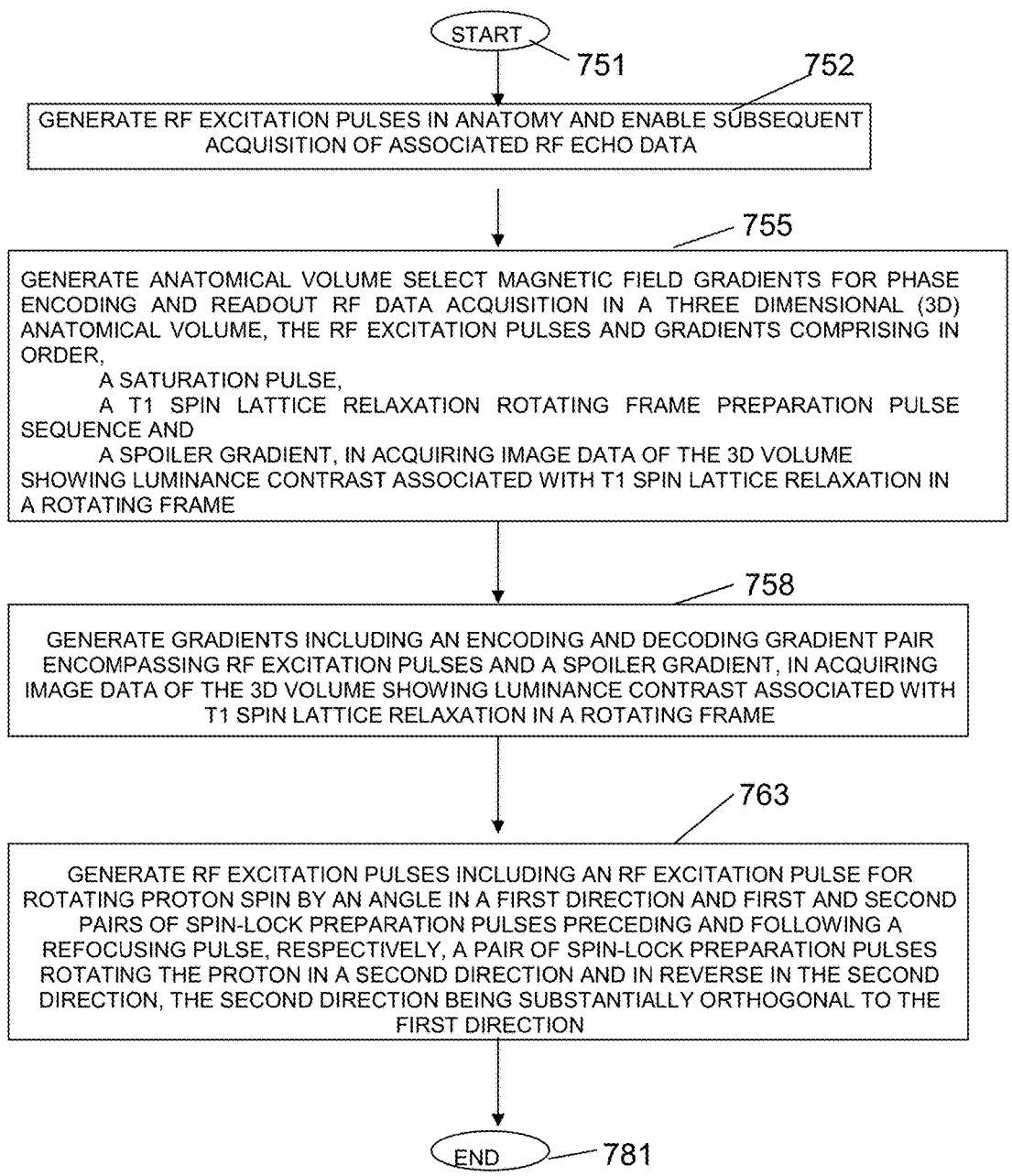
FIG. 7 shows a flowchart of a process performed by a system for acquiring MR imaging data of a portion of patient anatomy associated with spin lattice relaxation time in a rotating frame, according to invention principles.

FIG. 7 shows a flowchart of a process performed by system 10 (FIG. 1) for acquiring MR imaging data of a portion of patient anatomy associated with spin lattice relaxation time in a rotating frame. In step 752 following the start at step 751, an RF (Radio Frequency) signal generator comprising module 20 and RF coils 18 generate RF excitation pulses in anatomy and enable subsequent acquisition of associated RF echo data. In step 755, a magnetic field gradient generator (comprising magnetic coils 12 and 14) generates anatomical volume select magnetic field gradients for phase encoding and readout RF data acquisition in a three dimensional (3D) anatomical volume (comprising a two dimensional (2D) slice in one embodiment). The RF signal generator and the gradient generator generate and use in order, a saturation pulse, a T1 spin lattice relaxation rotating frame preparation pulse sequence and a spoiler gradient, in acquiring image data of the 3D volume showing luminance contrast associated with T1 spin lattice relaxation in a rotating frame. The saturation pulse comprises an RF pulse reducing RF magnetization to substantially zero prior to the T1 spin lattice relaxation rotating frame preparation pulse sequence. Also, the RF signal generator and the gradient generator use a readout gradient for RF data acquisition following the spoiler gradient.

In step 758, the RF signal generator and the gradient generator generate gradients including an encoding and decoding gradient pair encompassing an RF excitation pulse and a spoiler gradient, in acquiring image data of the 3D volume showing luminance contrast associated with T1 spin lattice relaxation in a rotating frame. In one embodiment, the encoding and decoding gradient pair encompassing an RF excitation pulse and a spoiler gradient, comprises a stimulated echo acquisition mode (STEAM) pulse sequence. The encoding and decoding gradient pair in an embodiment encompasses, a first RF excitation pulse and the spoiler gradient. Alternatively, the encoding and decoding gradient pair encompasses, a first RF excitation pulse, the spoiler gradient, a second RF excitation pulse and a readout gradient. The first RF excitation pulse substantially comprises a +90 degree pulse and the second RF excitation pulse comprises a 0-90 degree pulse. The RF signal generator and the gradient generator, following the decoding gradient, successively use for acquiring a k-space data set, multiple pulse sequences individually comprising, an RF excitation pulse and decoding gradient, for acquiring portions of k-space data. In one embodiment, the encoding and decoding gradients are substantially the same and comprise de-phasing gradients.

In step 763, the RF signal generator generates RF excitation pulses including an RF excitation pulse for rotating proton spin by an angle in a first direction and generates first and second pairs of spin-lock preparation pulses preceding and following a refocusing pulse, respectively. A pair of spin-lock preparation pulses rotate a proton in a second direction and in reverse in the second direction, the second direction being substantially orthogonal to the first direction. The first and second pairs of spin-lock preparation pulses preceding and following the refocusing pulse, comprise in order, a first pair of spin-lock preparation pulses for rotating the proton in the second direction and in reverse in the second direction, a refocusing pulse and a second pair of spin-lock preparation pulses for rotating the proton in the second direction and in reverse in the second direction. In one embodiment, the angle is substantially 90 degrees and the refocusing pulse is substantially a 180 degree pulse returning proton spins to the same starting phase existing following an initial excitation RF pulse. The T1 spin lattice relaxation rotating frame preparation pulse sequence following the first and second pairs of spin-lock preparation pulses comprises, an RF excitation pulse for rotating proton spin by an angle in a first direction and a spoiler gradient, in acquiring image data of the 3D volume showing luminance contrast associated with T1 spin lattice relaxation in a rotating frame. The process of FIG. 7 terminates at step 781.

A processor as used herein is a device for executing machine-readable instructions stored on a computer readable medium, for performing tasks and may comprise any one or combination of, hardware and firmware. A processor may also comprise memory storing machine-readable instructions executable for performing tasks. A processor acts upon information by manipulating, analyzing, modifying, converting or transmitting information for use by an executable procedure or an information device, and/or by routing the information to an output device. A processor may use or comprise the capabilities of a computer, controller or microprocessor, for example, and is conditioned using executable instructions to perform special purpose functions not performed by a general purpose computer. A processor may be coupled (electrically and/or as comprising executable components) with any other processor enabling interaction and/or communication there-between. A user interface processor or generator is a known element comprising electronic circuitry or software or a combination of both for generating display images or portions thereof. A user interface comprises one or more display images enabling user interaction with a processor or other device.

An executable application, as used herein, comprises code or machine readable instructions for conditioning the processor to implement predetermined functions, such as those of an operating system, a context data acquisition system or other information processing system, for example, in response to user command or input. An executable procedure is a segment of code or machine readable instruction, sub-routine, or other distinct section of code or portion of an executable application for performing one or more particular processes. These processes may include receiving input data and/or parameters, performing operations on received input data and/or performing functions in response to received input parameters, and providing resulting output data and/or parameters. A graphical user interface (GUI), as used herein, comprises one or more display images, generated by a display processor and enabling user interaction with a processor or other device and associated data acquisition and processing functions.

The UI also includes an executable procedure or executable application. The executable procedure or executable application conditions the display processor to generate signals representing the UI display images. These signals are supplied to a display device which displays the image for viewing by the user. The executable procedure or executable application further receives signals from user input devices, such as a keyboard, mouse, light pen, touch screen or any other means allowing a user to provide data to a processor. The processor, under control of an executable procedure or executable application, manipulates the UI display images in response to signals received from the input devices. In this way, the user interacts with the display image using the input devices, enabling user interaction with the processor or other device. The functions and process steps herein may be performed automatically or wholly or partially in response to user command. An activity (including a step) performed automatically is performed in response to executable instruction or device operation without user direct initiation of the activity.

Definitions.

T1rho (or "T-1-rho"), is the spin lattice relaxation time constant in the rotating frame, which determines the decay of the transverse magnetization in the presence of a "spin-lock" radio-frequency field and is an alternate MRI contrast method to visualize early pathological changes. The rotating frame is defined as the coordinate system that rotates about Z axis at the Larmor frequency of the scanner. In the rotating frame, a magnetization vector rotating at the Larmor frequency in the laboratory frame appears stationary.

(SAR)—the Specific Absorption Rate is defined as the RF power absorbed per unit of mass of an object, and is measured in watts per kilogram (W/kg).

EPI=Echo planar imaging involves image acquisition whereby a complete image is formed from a single data sample (k-space lines are acquired in one repetition time) of a gradient echo or spin echo sequence.

An inversion recovery (IR) pulse inverts longitudinal magnetization from the positive z-axis by 180 degrees to the negative z-axis. IR pulses are used as preparation pulses prior to a main imaging pulse sequence to achieve different kinds of MR contrast (such as T1 weighted, T2 weighted). Adiabatic IR pulses are used to give more uniform contrast throughout an imaging volume than non-adiabatic RF pulses.

iPAT (integrated Parallel Acquisition Techniques) comprises "parallel imaging". It enables faster scanning through reduced phase encoding and addition of RF coil information. An iPAT factor of 2 enables scanning about twice as fast, iPAT factor of 3 enables scanning about three times as fast and so on.

TI comprises inversion time, the time between an inversion recovery pulse and the next RF excitation pulse. TI determines the image contrast.

$T_1$ comprises the longitudinal (or spin-lattice) relaxation time $T_1$ decay constant.

$T_2$ comprises the transverse (or spin-spin) relaxation time $T_2$ is the decay constant for a proton spin component.

TR comprises repetition time, the time between successive RF excitation pulses.

FA comprises flip angle, i.e., an RF flip angle. For an inversion pulse, FA=180 degrees.

A saturation pulse (or saturation recovery pulse) comprises an RF pulse, typically 90 degrees (or any odd multiple of 90 degrees). Some systems use a spoiler gradient after the RF pulse. In a particular type of partial saturation pulse sequence a preceding pulse leaves the spins in a state of saturation, so that recovery at the time of the next pulse has taken place from an initial condition of no magnetization.

Adiabatic RF pulses=RF amplitude and frequency modulated pulses that are insensitive to the effects of B1-inhomogeneity and frequency offset (conventional RF pulses used in MRI are only amplitude modulated).

RF refocusing pulse=A radio frequency (RF) refocusing (or rephasing) pulse returns spins to the same starting phase that they had after an initial excitation RF pulse (an excitation RF pulse brings the magnetization from the longitudinal direction into the transverse plane). At the time point when the spins have reached the same starting phase, the available signal is maximal. That is the time point where the so-called "spin echo" occurs.

Spoiler gradient=a magnetic field gradient pulse applied to effectively remove transverse magnetization of a field coil by producing a rapid variation of its phase along the direction of the gradient.

Segmented data acquisition records the different parts of raw data space (the segments) in a periodic fashion by repeatedly playing out a pulse sequence comprising an inversion pulse sequence and MR data acquisition pulses and acquiring a different set of k-space lines during readout (acquisition). FIG. 1 shows an exemplary timing diagram of such a segmented sequence (gated using an ECG trigger but this is not required), and indicating how the data is placed to the raw data space.

B0 is the main static base MRI magnetic field.

B1 is the RF transmit coil field.

The system and processes of FIGS. 1-7 are not exclusive. Other systems, processes and menus may be derived in accordance with the principles of the invention to accomplish the same objectives. Although this invention has been described with reference to particular embodiments, it is to be understood that the embodiments and variations shown and described herein are for illustration purposes only. Modifications to the current design may be implemented by those skilled in the art, without departing from the scope of the invention. The system uses a pulse sequence including, a saturation pulse sequence, an advantageous T1rho preparation with improved off-resonance response and a STEAM echo sequence using split spin lock pulse pairs, to improve spin-lock magnetic field preparation. Further, the processes and applications may, in alternative embodiments, be located on one or more (e.g., distributed) processing devices on a network linking the units of FIG. 1. Any of the functions and steps provided in FIGS. 1-7 may be implemented in hardware, software or a combination of both.

What is claimed is:

1. A system for acquiring MR imaging data of a portion of patient anatomy associated with spin lattice relaxation time in a rotating frame, comprising:
   an RF (Radio Frequency) signal generator for generating RF excitation pulses in anatomy and enabling subsequent acquisition of associated RF echo data; and
   a magnetic field gradient generator for generating anatomical volume select magnetic field gradients for phase encoding and readout RF data acquisition in a three dimensional (3D) anatomical volume, said RF signal generator and said gradient generator using in order,
   a saturation pulse,
   a T1 spin lattice relaxation rotating frame preparation pulse sequence and
   a spoiler gradient, in acquiring image data of the 3D volume showing luminance contrast associated with T1 spin lattice relaxation in a rotating frame.

2. A system according to claim 1, wherein
   said RF signal generator and said gradient generator use a readout gradient for RF data acquisition following said spoiler gradient.

3. A system according to claim 1, wherein
   said saturation pulse comprises an RF pulse reducing RF magnetization to substantially zero prior to said T1 spin lattice relaxation rotating frame preparation pulse sequence.

4. A system according to claim 1, wherein
   said volume comprises a two dimensional (2D) slice.

5. A system for acquiring MR imaging data of a portion of patient anatomy associated with spin lattice relaxation time in a rotating frame, comprising:
   an RF (Radio Frequency) signal generator for generating RF excitation pulses in anatomy and enabling subsequent acquisition of associated RF echo data; and
   a magnetic field gradient generator for generating anatomical volume select magnetic field gradients for phase encoding and readout RF data acquisition in a three dimensional (3D) anatomical volume, said RF signal generator and said gradient generator using in order,
   a T1 spin lattice relaxation rotating frame preparation pulse sequence,
   an encoding and decoding gradient pair encompassing RF excitation pulses and a spoiler gradient, in acquiring image data of the 3D volume showing luminance contrast associated with T1 spin lattice relaxation in a rotating frame.

6. A system according to claim 5, wherein
   said encoding and decoding gradient pair encompassing RF excitation pulses and a spoiler gradient, comprises a stimulated echo acquisition mode (STEAM) pulse sequence.

7. A system according to claim 5, wherein
   said encoding and decoding gradient pair encompasses,
   a first RF excitation pulse,
   said spoiler gradient,
   a second RF excitation pulse and
   a readout gradient.

8. A system according to claim 7, wherein
   said first RF excitation pulse substantially comprises a +90 degree pulse and
   said second RF excitation pulse comprises a 0-90 degree pulse.

9. A system according to claim 7, wherein
   said RF signal generator and said gradient generator, following said decoding gradient, successively use for acquiring a k-space data set, a plurality of pulse sequences individually comprising,
   an RF excitation pulse and decoding gradient, for acquiring portions of k-space data.

10. A system according to claim 5, wherein
    said encoding and decoding gradients are substantially the same and comprise de-phasing gradients.

11. A system for acquiring MR imaging data of a portion of patient anatomy associated with spin lattice relaxation time in a rotating frame, comprising:
    an RF (Radio Frequency) signal generator for generating RF excitation pulses in anatomy and enabling subsequent acquisition of associated RF echo data; and
    a magnetic field gradient generator for generating anatomical volume select magnetic field gradients for phase encoding and readout RF data acquisition in a three dimensional (3D) anatomical volume, said RF signal generator and said gradient generator providing
    a T1 spin lattice relaxation rotating frame preparation pulse sequence comprising,
    an RF excitation pulse for rotating proton spin by an angle in a first direction and
    first and second pairs of spin-lock preparation pulses preceding and following a refocusing pulse, respectively, a pair of spin-lock preparation pulses rotating said proton in a second direction and in reverse in said second direction, said second direction being substantially orthogonal to said first direction.

12. A system according to claim 11, wherein
    said first and second pairs of spin-lock preparation pulses preceding and following said refocusing pulse, comprising in order,
    a first pair of spin-lock preparation pulses for rotating said proton in said second direction and in reverse in said second direction,
    a refocusing pulse and a second pair of spin-lock preparation pulses for rotating said proton in said second direction and in reverse in said second direction.

13. A system according to claim 11, wherein
said T1 spin lattice relaxation rotating frame preparation pulse sequence following said first and second pairs of spin-lock preparation pulses comprises,
   an RF excitation pulse for rotating proton spin by an angle in a first direction and
   a spoiler gradient, in acquiring image data of the 3D volume showing luminance contrast associated with T1 spin lattice relaxation in a rotating frame.

14. A system according to claim 11, wherein
said angle is substantially 90 degrees and
said refocusing pulse is substantially a 180 degree pulse returning proton spins to the same starting phase existing following an initial excitation RF pulse.

15. A method for acquiring MR imaging data of a portion of patient anatomy associated with spin lattice relaxation time in a rotating frame, comprising the activities of:
   generating RF excitation pulses in anatomy and enabling subsequent acquisition of associated RF echo data; and
   generating anatomical volume select magnetic field gradients for phase encoding and readout RF data acquisition in a three dimensional (3D) anatomical volume, said RF excitation pulses and gradients comprising in order,
      a saturation pulse,
      a T1 spin lattice relaxation rotating frame preparation pulse sequence and
      a spoiler gradient, in acquiring image data of the 3D volume showing luminance contrast associated with T1 spin lattice relaxation in a rotating frame.

16. A method according to claim 15, wherein
said gradients include an encoding and decoding gradient pair encompassing RF excitation pulses and a spoiler gradient, in acquiring image data of the 3D volume showing luminance contrast associated with T1 spin lattice relaxation in a rotating frame.

17. A method according to claim 15, wherein
said RF excitation pulses include an RF excitation pulse for rotating proton spin by an angle in a first direction and first and second pairs of spin-lock preparation pulses preceding and following a refocusing pulse, respectively, a pair of spin-lock preparation pulses rotating said proton in a second direction and in reverse in said second direction, said second direction being substantially orthogonal to said first direction.

* * * * *